US010388905B2

(12) United States Patent
Choi et al.

(10) Patent No.: US 10,388,905 B2
(45) Date of Patent: *Aug. 20, 2019

(54) DISPLAY DEVICE HAVING AN AUXILIARY ELECTRODE

(71) Applicant: LG Display Co., Ltd., Seoul (KR)

(72) Inventors: Ho-Won Choi, Paju-si (KR); Hye-Sook Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/788,737

(22) Filed: Oct. 19, 2017

(65) Prior Publication Data

US 2018/0190934 A1 Jul. 5, 2018

(30) Foreign Application Priority Data

Dec. 29, 2016 (KR) ........................ 10-2016-0182441

(51) Int. Cl.
*H01L 51/52* (2006.01)
*H01L 27/32* (2006.01)

(52) U.S. Cl.
CPC ...... *H01L 51/5228* (2013.01); *H01L 27/3246* (2013.01); *H01L 27/3258* (2013.01); *H01L 27/3262* (2013.01); *H01L 27/326* (2013.01)

(58) Field of Classification Search
CPC ............ H01L 51/5228; H01L 27/3246; H01L 27/3258; H01L 27/326
See application file for complete search history.

(56) References Cited

U.S. PATENT DOCUMENTS

| 7,701,132 B2* | 4/2010 | Oh .................... H01L 27/3276 257/72 |
| 8,115,376 B2 | 2/2012 | Fujioka et al. |
| 8,598,777 B2 | 12/2013 | Fujioka et al. |
| 8,747,177 B2 | 6/2014 | Fujioka et al. |
| 8,928,011 B2* | 1/2015 | Tanada ................ H01L 27/3204 257/347 |

(Continued)

FOREIGN PATENT DOCUMENTS

| CN | 103311265 B | 5/2016 |
| CN | 106206645 A | 12/2016 |

(Continued)

OTHER PUBLICATIONS

European Patent Office, Communication Pursuant to Article 94(3) EPC, EP Patent Application No. 17210073.7, dated Oct. 18, 2018, six pages.

(Continued)

*Primary Examiner* — Tuan A Hoang
(74) *Attorney, Agent, or Firm* — Fenwick & West LLP

(57) ABSTRACT

A display device includes an auxiliary electrode in order to prevent uneven brightness by the voltage drop. The display device further includes an under-cut region formed by stacked insulating layers. In the display device, the under-cut region is completely filled by filler due to changing a shape of the auxiliary electrode, so that the quality of the displaying image is improved. Also, in the display device, the contact area between an upper electrode of a light-emitting structure and the auxiliary electrode is increased, so that the reliability and the degree of integration are improved.

19 Claims, 7 Drawing Sheets

(56) References Cited

U.S. PATENT DOCUMENTS

| | | | |
|---|---|---|---|
| 9,859,520 B2 | 1/2018 | Kim | |
| 2010/0244664 A1 | 9/2010 | Fujioka et al. | |
| 2011/0114957 A1 | 5/2011 | Kim et al. | |
| 2012/0086328 A1 | 4/2012 | Fujioka et al. | |
| 2013/0210312 A1 | 8/2013 | Fujioka et al. | |
| 2014/0183501 A1* | 7/2014 | Kim | H01L 27/3246 257/40 |
| 2014/0346484 A1* | 11/2014 | Nendai | H01L 51/5228 257/40 |
| 2014/0374732 A1* | 12/2014 | Jeong | H01L 27/3246 257/40 |
| 2015/0001507 A1* | 1/2015 | Kim | H01L 27/3246 257/40 |
| 2015/0076476 A1 | 3/2015 | Odaka et al. | |
| 2015/0137090 A1 | 5/2015 | Lee et al. | |
| 2016/0043341 A1 | 2/2016 | Heo et al. | |
| 2016/0079325 A1 | 3/2016 | Lee et al. | |
| 2016/0149155 A1 | 5/2016 | Kim | |
| 2018/0120620 A1* | 5/2018 | Shim | H01L 51/5228 |
| 2018/0122876 A1* | 5/2018 | Shim | H01L 27/3276 |

FOREIGN PATENT DOCUMENTS

| | | |
|---|---|---|
| EP | 2 998 997 A1 | 3/2016 |
| EP | 3 026 724 A1 | 6/2016 |
| EP | 3 136 440 A1 | 3/2017 |
| JP | 2009-105068 A | 5/2009 |
| KR | 2016-0127459 A | 11/2016 |
| TW | 201239855 | 10/2012 |

OTHER PUBLICATIONS

European Patent Office, Extended European Search Report, EP Patent Application No. 17210073.7, dated Jun. 1, 2018, five pages.

Japan Patent Office, Notification of Reasons for Refusal, JP Patent Application No. 2017-244808, dated Jan. 8, 2019, nine pages.

Taiwan Patent Office, Office Action, TW Patent Application No. 106146567, dated Dec. 5, 2018, 12 pages.

* cited by examiner

DISPLAY DEVICE HAVING AN AUXILIARY ELECTRODE

CROSS-REFERENCE TO RELATED APPLICATIONS

This application claims priority to Republic of Korea Patent Application No. 10-2016-0182441 filed on Dec. 29, 2016, which is hereby incorporated by reference as if fully set forth herein.

BACKGROUND

Field of the Invention

The present invention relates to a display device including an auxiliary electrode in order to prevent uneven brightness by the voltage drop.

Discussion of the Related Art

Generally, electronic appliances, such as a monitor, a TV, a laptop computer, and a digital camera, include a display device to realize an image. For example, the display device may include a liquid crystal display device and/or an organic light-emitting display device.

The display device may include a plurality of pixel areas. Each pixel area may display a color different from the adjacent pixel area. For example, the display device may include a blue pixel area displaying blue color, a red pixel area displaying red color, a green pixel area displaying green color, and a white pixel area displaying white color.

In the display device, a light-emitting structure may be disposed on each pixel area. For example, the light-emitting structure may include a lower electrode, a light-emitting layer, and an upper electrode, which are sequentially stacked. The upper electrode may be a common electrode. For example, in the display device, the upper electrode of the pixel area may be connected to the upper electrode of the adjacent pixel area.

The display device may include an auxiliary electrode in order to prevent uneven brightness by a voltage drop of the upper electrode. For example, the auxiliary electrode may extend along a direction between the pixel areas. The upper electrode may be electrically connected to the auxiliary electrode. The display device may include a structure capable of connecting the upper electrode to the auxiliary electrode. For example, the display device may include an under-cut region by insulating layers which are disposed on the auxiliary electrode.

However, since the vertical thickness of the insulating layers on the auxiliary electrode is not enough, the filler filling a space between the lower substrate and the upper substrate may not suitably flow into the under-cut region. Thus, in the display device, a void generated by a portion not filled by the filler may be generated in the under-cut region. In the display device, since the void may look like a spot, the quality of the display image may be degraded by the void.

In the display device, the size of the under-cut region may be reduced in order to prevent the void generated by a portion not filled by the filler. However, when the size of the under-cut region is reduced, a portion of the auxiliary electrode which is not covered by the light-emitting layer may be reduced. Thus, in the display device, the contact area between the upper electrode of the light-emitting structure and the auxiliary electrode may be reduced, and thereby, the reliability for the electrical connection may be degraded.

SUMMARY

Accordingly, the present disclosure is directed to a display device including an auxiliary electrode in order to prevent uneven brightness by the voltage drop that substantially obviates one or more problems due to limitations and disadvantages of the related art.

An object of the present disclosure is to provide a display device, which may prevent that a void is generated in an under-cut region formed by insulating layers on an auxiliary electrode.

Another object of the present disclosure is to provide a display device, which may suitably secure the contact area between an upper electrode and an auxiliary electrode.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, there is provided a display device including a base insulating layer on a lower substrate. The base insulating layer includes a base penetrating hole. A lower insulating layer is disposed on the base insulating layer. The lower insulating layer includes a lower penetrating hole overlapping with the base penetrating hole. An upper insulating layer is disposed on the lower insulating layer. The upper insulating layer includes a protrusion region extending onto the lower penetrating hole. The base insulating layer includes a first side region overlapping with the protrusion region of the upper insulating layer. An auxiliary electrode is disposed in the base penetrating hole on the lower substrate. The auxiliary electrode extends onto the first side region of the base insulating layer.

An end portion of the auxiliary electrode disposed close to the first side region of the base insulating layer may be disposed between the base insulating layer and the lower insulating layer.

The upper insulating layer may further include an upper penetrating hole exposing a second side region of the base insulating layer.

The auxiliary electrode may extend onto the second side region of the base insulating layer.

A thin film transistor may be disposed on the lower substrate. The thin film transistor may be spaced apart from the auxiliary electrode. A lower passivation layer may be disposed on the thin film transistor. A light-emitting structure may be disposed on the lower passivation layer. The light-emitting structure may include a lower electrode, a light-emitting layer and an upper electrode, which area sequentially stacked. The lower electrode may be connected to the thin film transistor. The upper electrode may be connected to the auxiliary electrode. The lower insulating layer may include a same material as the lower passivation layer.

A bank insulating layer may be disposed on the lower insulating layer. The bank insulating layer may cover an edge of the lower electrode. The upper insulating layer may include a same material as the bank insulating layer.

The thin film transistor may include a semiconductor pattern, a gate insulating layer, a gate electrode, a source electrode and a drain electrode. The auxiliary electrode may include a same material as the source electrode and the drain electrode.

The thin film transistor may further include an interlayer insulating layer between the gate electrode and the source/drain electrodes. The base insulating layer may include a same material as the interlayer insulating layer.

In another aspect of the present disclosure, a display device comprises a base insulating layer on a lower substrate. The base insulating layer includes a base penetrating hole. An auxiliary electrode is disposed on the lower substrate and the base insulating layer. The auxiliary electrode includes a first electrode region disposed in the base penetrating hole of the base insulating layer, and a second electrode region. A lower insulating layer is disposed on the base insulating layer. The lower insulating layer includes a lower penetrating hole overlapping with the base penetrating hole. An upper insulating layer is disposed on the lower insulating layer. The upper insulating layer includes a protrusion region overlapping the first electrode region of the auxiliary electrode, and an upper penetrating hole overlapping with the second electrode region of the auxiliary electrode.

A vertical distance between the first electrode region of the auxiliary and the protrusion region of the upper insulating layer may be larger than a vertical thickness of the lower insulating layer.

The base insulating layer may include a first base insulating layer and a second base insulating layer. The first base insulating layer may be disposed close to the lower substrate. The second base insulating layer may be disposed between the first base insulating layer and the lower insulating layer. The second base insulating layer may include a second penetrating hole. The second penetrating hole may overlap the first penetrating hole.

The size of the first base penetrating hole may be smaller than that of the second base penetrating hole.

A thin film transistor may be disposed on the lower substrate. The thin film transistor may be spaced apart from the auxiliary electrode. A buffer layer may be disposed between the lower substrate and the thin film transistor. The first base insulating layer may include a same material as the buffer layer.

The thin film transistor may include a gate electrode, a gate insulating layer, a semiconductor pattern, a source electrode and a drain electrode. The second base insulating layer may include a same material as the gate insulating layer.

A light-emitting structure may be disposed on the lower substrate. The light-emitting structure may include a lower electrode, a light-emitting structure and an upper electrode. The base insulating layer may include a first side region and a second side region. The first side region may be disposed close to the first electrode region of the auxiliary electrode. The second side region may be disposed close to the second electrode region of the auxiliary electrode.

In further another aspect of the present disclosure, a display device comprises an auxiliary electrode on a lower substrate. A lower insulating layer is disposed on the lower substrate. The lower insulating layer includes a lower penetrating hole exposing the auxiliary electrode. An upper insulating layer is disposed on the lower insulating layer. The upper insulating layer includes a protrusion region covering a portion of the auxiliary electrode. A base insulating layer is disposed between the lower substrate and the lower insulating layer. The base insulating layer includes a first side region overlapping with the protrusion region of the upper insulating layer, and a second side region exposed by the upper insulating layer. The auxiliary electrode extends onto the first side region and the second side region of the base insulating layer.

The first side region and the second side region of the base insulating layer may overlap the lower penetrating hole of the lower insulating layer.

An end portion of the auxiliary electrode may be disposed between the base insulating layer and the lower insulating layer.

The upper insulating layer may include a first upper insulating layer and a second upper insulating layer. The first upper insulating layer may be disposed between the lower insulating layer and the second upper insulating layer. A side of the first upper insulating layer overlapping with the auxiliary electrode may be a shape different from a side of the second upper insulating layer.

The side of the first upper insulating layer overlapping with the auxiliary electrode may be negatively tapered.

Embodiments also relate to a display device. The display device includes a first base insulating layer having a first opening and an auxiliary electrode. The auxiliary electrode includes a first part extending in a first direction, and a second part extending in a second direction intersecting with the first direction. The second part is disposed on a side surface of the first opening in the first base insulating layer. The display device also includes a first upper insulating layer over the second part of the auxiliary electrode and over at least a portion of the first part of the auxiliary electrode. The first upper insulating layer protrudes in the first direction. The display device also includes a light emitting structure including an upper electrode. At least a part of the upper electrode contacts the second part of the auxiliary electrode.

In one embodiment, the display device includes a lower insulating layer on the first base insulating layer. The lower insulating layer has a second opening, and the upper electrode contacts a side surface of the second opening in the lower insulating layer. The auxiliary electrode may include a third part extending in the first direction and disposed between the lower insulating layer and the first base insulating layer.

In one embodiment, the auxiliary electrode includes a third part extending in the second direction on another side surface of the first opening in the first base insulating layer.

In one embodiment, the light emitting structure includes a light-emitting layer that contacts the third part of the auxiliary electrode.

In one embodiment, a vertical distance in the second direction between the first part of the auxiliary electrode and the first upper insulating layer is greater than a thickness of the first base insulating layer.

In one embodiment, the display device further includes a buffer layer and a thin film transistor (TFT) on the buffer layer. The TFT is electrically connected to the light emitting structure. The first base insulating layer may be in a same layer as the buffer layer, and the first part of the auxiliary electrode may contact a substrate on which the buffer layer is formed.

In one embodiment, the display device further includes a second base insulating layer on the first base insulating layer. The second base insulating layer has a second opening. The auxiliary electrode may include a third part extending in the second direction on a side surface of the second opening in the second base insulating layer.

In one embodiment, the upper electrode contacts the third part of the auxiliary electrode.

In one embodiment, the TFT includes a drain electrode, a semiconductor layer, and an interlayer insulating layer between the drain electrode and the semiconductor layer. The second base insulating layer may be in a same layer as the interlayer insulating layer of the TFT.

In one embodiment, the TFT includes a gate insulating layer, and the second base insulating layer may be in a same layer as the gate insulating layer of the TFT.

In one embodiment, the display device further includes a buffer layer and a thin film transistor (TFT) on the buffer layer electrically connected to the light emitting structure. The first base insulating layer is on the buffer layer, and the first part of the auxiliary electrode may contact the buffer layer.

In one embodiment, the TFT includes a drain electrode, a semiconductor layer, and an interlayer insulation layer between the drain electrode and the semiconductor layer. The first base insulating layer may be in a same layer as the interlayer insulating layer of the TFT.

In one embodiment, the TFT includes a gate insulating layer, and the first base insulating layer is in a same layer as the gate insulating layer.

In one embodiment, the display device further includes a second base insulating layer on the first base insulating layer. The second base insulating layer has a second opening. The auxiliary electrode may include a third part extending in the second direction on a side surface of the second opening in the second base insulating layer.

In one embodiment, the upper electrode contacts the third part of the auxiliary electrode.

In one embodiment, the display device further includes a second upper insulating layer on the first upper insulating layer, over the second part of the auxiliary electrode, and over the portion of the first part of the auxiliary electrode. The second upper insulating layer protrudes in the first direction.

In one embodiment, a first width of the first opening at a first distance from the first part of the auxiliary electrode is wider than a second width of the first opening at a second distance from the first part of the auxiliary electrode, where the first distance is greater than the second distance.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1:
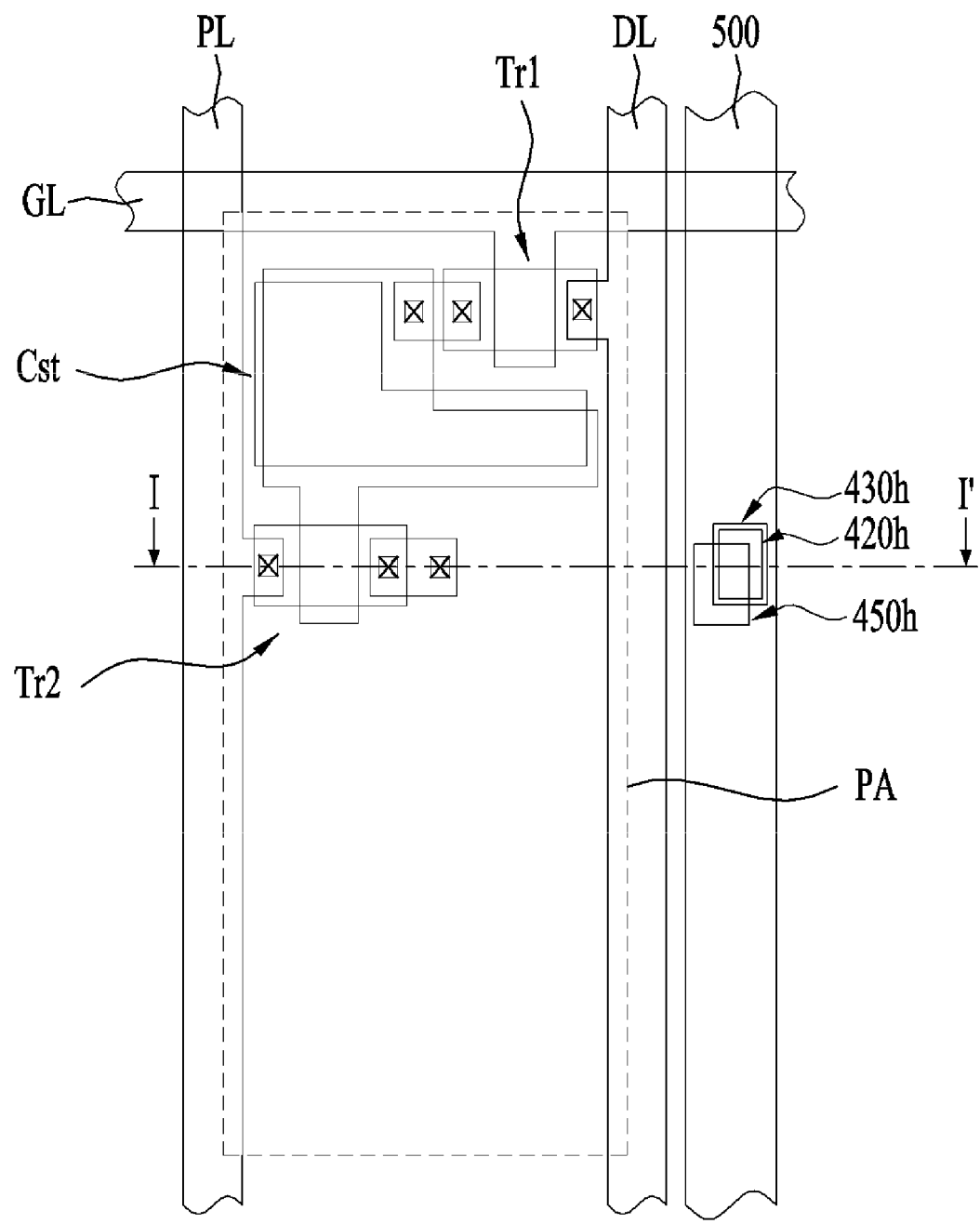
FIG. 1 is a plan view schematically showing a display device according to an embodiment of the present disclosure.

Hereinafter, details related to the above objects, technical configurations, and operational effects of the embodiments of the present invention will be clearly understood by the following detailed description with reference to the drawings, which illustrate some embodiments of the present invention. Here, the embodiments of the present invention are provided in order to allow the technical sprit of the present invention to be satisfactorily transferred to those skilled in the art, and thus the present invention may be embodied in other forms and is not limited to the embodiments described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present invention.

The terms used in the specification of the present invention are merely used in order to describe particular embodiments, and are not intended to limit the scope of the present invention. For example, an element described in the singular form is intended to include a plurality of elements unless the context clearly indicates otherwise. In addition, in the specification of the present invention, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiment

Figure 2:
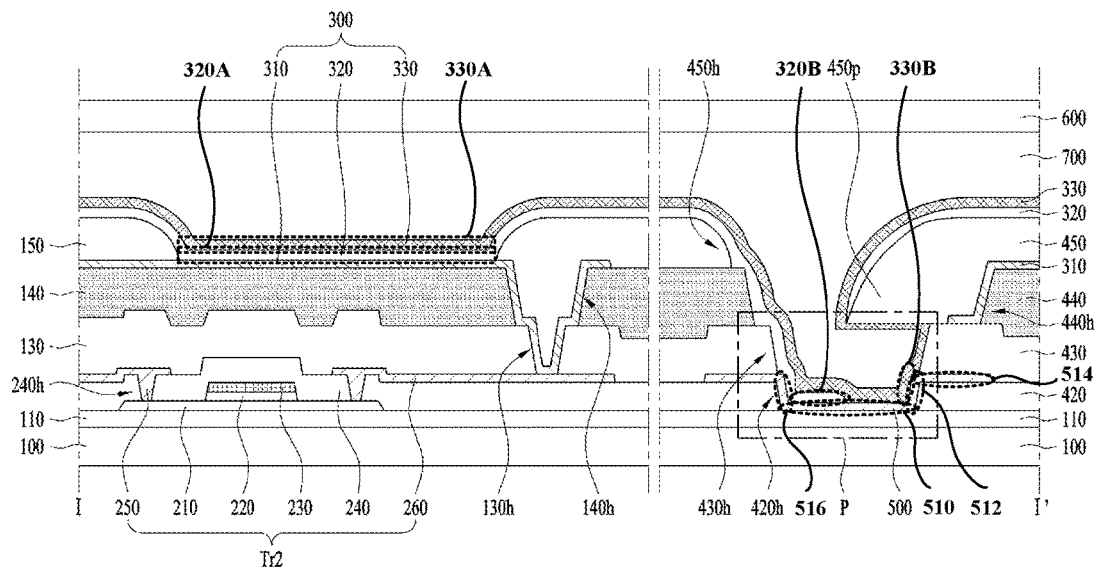
FIG. 2 is a cross-section view taken along line I-I' of FIG. 1 according to an embodiment of the present disclosure.
Figure 3:
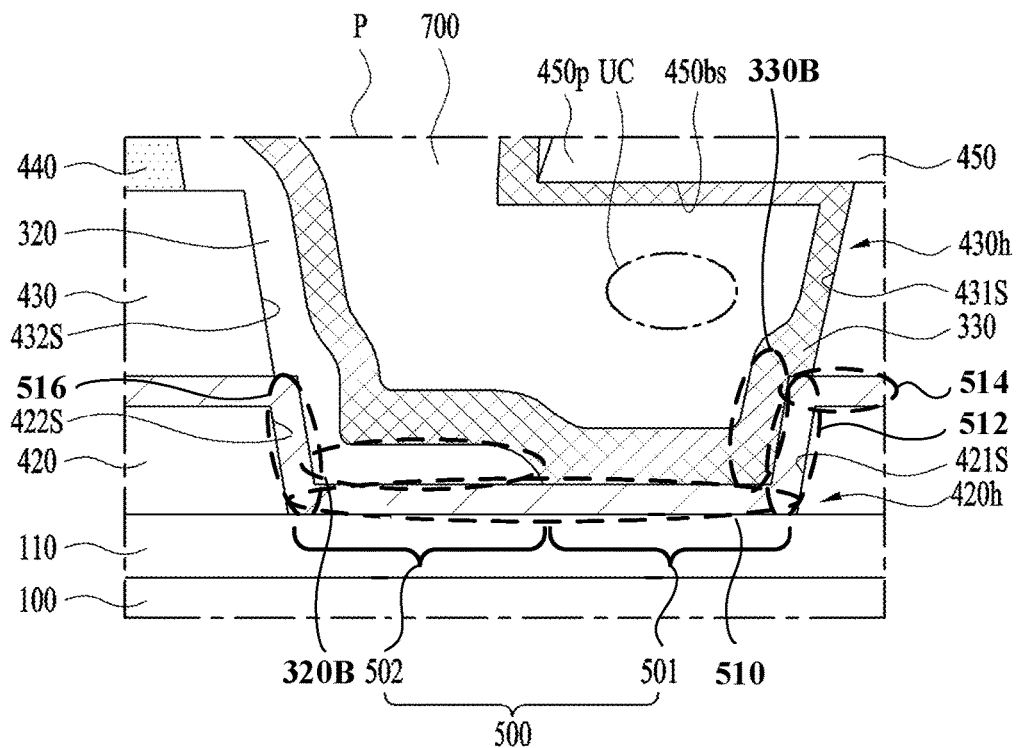
FIG. 3 is an enlarged view of region P in FIG. 2 according to an embodiment of the present disclosure.

FIG. 1 is a plan view schematically showing a display device according to an embodiment of the present disclosure. FIG. 2 is a cross-section view taken along line I-I' of FIG. 1 according to an embodiment of the present disclosure. FIG. 3 is an enlarged view of region P in FIG. 2 according to an embodiment of the present disclosure.

Referring to FIGS. 1 to 3, the display device according to the embodiment of the present disclosure may include a lower substrate 100, a thin film transistor Tr1 and Tr2, a light-emitting structure 300, an auxiliary electrode 500, an upper substrate 600, and a filler 700.

The lower substrate 100 may support the thin film transistor Tr1 and Tr2, the light-emitting structure 300 and the auxiliary electrode 500. The lower substrate 100 may include an insulating material. For example, the lower substrate 100 may include glass or plastic.

A gate line GL, a data line DL, and a power supply line PL may be disposed on the lower substrate 100. The gate line GL may extend along a direction. The data line DL may intersect the gate line GL. The data line DL may be disposed on a layer different from the gate line GL. The power supply line PL may be parallel with the gate line GL or the data line DL. For example, the power supply line PL may intersect the gate line GL. The power supply line PL may be disposed on a same layer as the data line DL.

The gate line GL, the data line DL, and the power supply line PL may define a pixel area PA. For example, the pixel area PA may be surrounded by the gate line GL, the data line DL and the power supply line PL. A circuit for controlling the light-emitting structure 500 may be disposed in the pixel area. For example, a selection thin film transistor Tr1, a driving thin film transistor Tr2, and a storage capacitor Cst may be disposed in the pixel area.

The selection thin film transistor Tr1 may turn on/off the driving thin film transistor Tr2 according to a gate signal applied through the gate line GL. The driving thin film transistor Tr2 may supply a driving current to the corresponding light-emitting structure 300 according to a signal of the selection thin film transistor Tr1. The storage capacitor Cst may maintain the signal of the selection thin film transistor Tr1 applied to the driving thin film transistor Tr2 for a predetermined time.

The structure of the driving thin film transistor Tr2 may be same as the structure of the selection thin film transistor Tr1. For example, the driving thin film transistor Tr2 may include a semiconductor pattern 210, a gate insulating layer 220, a gate electrode 230, an interlayer insulating layer 240, a source electrode 250, and a drain electrode 260.

The semiconductor pattern 210 may be disposed close to the lower substrate 100. The semiconductor pattern 210 may include a semiconductor material. For example, the semiconductor pattern 210 may include amorphous silicon or polycrystalline silicon. The semiconductor pattern 210 may include an oxide semiconductor material. For example, the semiconductor pattern 210 may include IGZO.

The semiconductor pattern 210 may include a source region, a drain region, and a channel region. The channel region may be disposed between the source region and the drain region. The conductivity of the channel region may be lower than that of the source region and the drain region. For example, the source region and the drain region may include a conductive impurity.

The display device according to the embodiment of the present disclosure may further include a buffer layer 110 between the lower substrate 100 and the semiconductor pattern 210. The buffer layer 110 may extend to the outside of the semiconductor pattern 210. For example, the buffer layer 110 may fully cover a surface of the lower substrate 100. The buffer layer 110 may include an insulating material. For example, the buffer layer 110 may include silicon oxide.

The gate insulating layer 220 may be disposed on the semiconductor pattern 210. The gate insulating layer 220 may include an insulating material. For example, the gate insulating layer 220 may include silicon oxide and/or silicon nitride. The gate insulating layer 220 may be a multi-layer structure. The gate insulating layer 220 may include a High-K material. For example, the gate insulating layer 220 may include hafnium oxide (HfO) or titanium oxide (TiO).

The gate electrode 230 may be disposed on the gate insulating layer 220. The gate electrode 230 may overlap the channel region of the semiconductor pattern 210. The gate electrode 230 may be insulated from the semiconductor pattern 210 by the gate insulating layer 220. For example, the gate electrode 230 may include a side vertically aligned with a side of the gate insulating layer 220. The side of the gate insulating layer 220 may be continuous with the side of the gate electrode 230.

The gate electrode 230 may include a conductive material. For example, the gate electrode 230 may include a metal such as aluminum (Al), chrome (Cr), copper (Cu), titanium (Ti), molybdenum (Mo), and tungsten (W). The gate electrode 230 may be a multi-layer structure. The gate line GL may include a same material as the gate electrode 230. The gate electrode 230 may be disposed on a layer as the gate line GL. For example, the structure of the gate line GL may be same as the structure of the gate electrode 230.

The interlayer insulating layer 240 may be disposed on the semiconductor pattern 210 and the gate electrode 230. The interlayer insulating layer 240 may extend to the outside of the semiconductor pattern 210. For example, the interlayer insulating layer 240 may be in direct contact with the buffer layer 110 on the outside of the semiconductor pattern 210. The interlayer insulating layer 240 may include an insulating material. For example, the interlayer insulating layer 240 may include silicon oxide.

The source electrode 250 and the drain electrode 260 may be disposed on the interlayer insulating layer 240. The source electrode 250 may be electrically connected to the source region of the semiconductor pattern 210. The drain electrode 260 may be electrically connected to the drain region of the semiconductor pattern 210. For example, the interlayer insulating layer 240 may include interlayer contact holes exposing the source region and the drain region of the semiconductor pattern 210. The drain electrode 260 may be spaced apart from the source electrode 250.

The source electrode 250 and the drain electrode 260 may include a conductive material. For example, the source electrode 250 and the drain electrode 260 may include a metal such as aluminum (Al), chrome (Cr), copper (Cu), titanium (Ti), molybdenum (Mo) and tungsten (W). The drain electrode 260 may include a same material as the source electrode 250. The source electrode 250 may be a multi-layer structure. The structure of the drain electrode 260 may be same as the structure of the source electrode 250. For example, the drain electrode 260 may be a multi-layer structure.

The data line DL and the power supply line PL may include a same material as the source electrode 250 and the drain electrode 260. For example, the source electrode 250 and the drain electrode 260 may be disposed on a layer as the data line DL and the power supply line PL. The data line DL and the power supply line PL may be disposed on the interlayer insulating layer 240. The structure of the data line DL and the structure of the power supply line PL may be same as the structure of the source electrode 250 and the structure of the drain electrode 260. For example, the data line DL and the power supply line PL may be a multi-layer structure.

The display device according to the embodiment of the present disclosure may further include a lower passivation layer 130 on the thin film transistor Tr1 and Tr2. The lower passivation layer 130 may prevent the damage of the thin-film transistor Tr1 and Tr2 from moisture of the outside and external impact. The lower passivation layer 130 may extend to the outside of the source electrode 250 and the drain electrode 260. The lower passivation layer 130 may include an insulating layer. For example, the lower passivation layer 130 may include silicon oxide and/or silicon nitride. The lower passivation layer 130 may be a multi-layer structure.

The display device according to the embodiment of the present disclosure may further include an over-coat layer 140 on the lower passivation layer 130. The over-coat layer 140 may remove a thickness difference due to the thin film transistor Tr1 and Tr2. For example, an upper surface of the over-coat layer 140 opposite the lower substrate 100 may be a flat surface. The upper surface of the over-coat layer 140 may be parallel with a surface of the lower substrate 100. The over-coat layer 140 may include an insulating material. For example, the over-coat layer 140 may include an organic insulating material.

The light-emitting structure 300 may realize a specific color. For example, the light-emitting structure 300 may include a lower electrode 310, a light-emitting layer 320, and an upper electrode 330, which are sequentially stacked.

The light-emitting structure 300 may be controlled by the thin film transistor Tr1 and Tr2 of the corresponding circuit. For example, the lower electrode 310 of the light-emitting structure 300 may be electrically connected to the corresponding driving thin film transistor Tr2. The light-emitting structure 300 may be disposed on the over-coat layer 140. For example, the lower passivation layer 130 and the over-coat layer 140 may include a first contact hole 130$h$ and a second contact hole 140$h$ exposing the drain electrode 260 of the corresponding driving thin film transistor Tr2. The lower electrode 310 may be electrically connected to the drain electrode 260 of the corresponding driving thin film transistor Tr2 through the first contact hole 130$h$ and the second contact hole 140$h$.

The lower electrode 310 may include a conductive material. The lower electrode 310 may include a high-reflective material. For example, the lower electrode 310 may include a metal such as aluminum Al and argentum Ag. The lower electrode 310 may be a multi-layer structure. For example, the lower electrode 310 may be a structure including a reflective electrode having a high-reflective material between transparent electrodes having a transparent conductive material, such as ITO and IZO.

The light-emitting layer 320 may generate light, the brightness of which corresponds to the voltage difference between the lower electrode 310 and the upper electrode 330. For example, the light-emitting layer 320 may include an emission material layer (EML) having a light-emission material. The light-emission material may be an organic light-emitting material, an inorganic light-emitting material, and/or a hybrid light-emitting material. For example, the display device according to the embodiment of the present disclosure may be an organic light-emitting display device including a light-emitting layer 320 of an organic light-emitting material.

The light-emitting layer 320 may be a multi-layer structure. For example, the light-emitting layer 320 may further include at least one of a hole injection layer (HIL), a hole transporting layer (HTL), an electron transporting layer (ETL), and an electron injection layer (EIL).

The upper electrode 330 may include a conductive material. The structure of the upper electrode 330 may be different form the structure of the lower electrode 310. For example, the upper electrode 330 may be a transparent electrode. Thus, in the display device according to the embodiment of the present disclosure, the light generated by the light-emitting layer 320 may be emitted through the upper electrode 330.

In the display device according to the embodiment of the present disclosure, the light-emitting structures 300 in the adjacent pixel areas PA may be individually controlled. For example, the display device according to the embodiment of the present disclosure may further include a bank insulating layer 150 insulating the lower electrode 310 of the light-emitting structure 300 from the lower electrode 310 of the light-emitting structure 300 on the adjacent pixel area PA. The bank insulating layer 150 may cover an edge of the lower electrode 310. The light-emitting layer 320 and the upper electrode 330 may be sequentially stacked on a surface of the lower electrode 310 exposed by the bank insulating layer 150. The bank insulating layer 150 may include an insulating material. For example, the bank insulating layer 150 may include an organic insulating material. The bank insulating layer 150 may be in direct contact with the over-coat layer 140 outside the boundary of the lower electrode 310. The bank insulating layer 150 may include a material different from the over-coat layer 140.

The auxiliary electrode 500 may be disposed on the lower substrate 100. The auxiliary electrode 500 may be disposed outside the pixel area PA. For example, the auxiliary electrode 500 may be disposed on the outside of the data line DL. The thin film transistor Tr1 and Tr2 and the storage capacitor Cst may be spaced apart from the auxiliary electrode 500. The auxiliary electrode 500 may extend along a first direction. For example, the auxiliary electrode 500 may be parallel with the data line DL.

The display device according to the embodiment of the present disclosure is described that the auxiliary electrode 500 is a line-shape extending along a direction between the adjacent pixel areas PA. However, the display device according to another embodiment of the present disclosure may include an auxiliary electrode 500 surrounding the pixel area PA. For example, in the display device according to another embodiment of the present disclosure, the auxiliary electrode 500 may be a mesh shape.

The auxiliary electrode 500 may include a conductive material. For example, the auxiliary electrode 500 may include a metal such as aluminum (Al), chrome (Cr), copper (Cu), titanium (Ti), molybdenum (Mo) and tungsten (W). The auxiliary electrode 500 may be a multi-layer structure.

The auxiliary electrode 500 may include a same material as one of conductive layers composing the thin-film transistor Tr1 and Tr2. For example, the auxiliary electrode 500 may include a same material as the source electrode 250 and the drain electrode 260. The auxiliary electrode 500 may have a same structure as the source electrode 250 and the drain electrode 260. For example, the auxiliary electrode 500 may be formed with the source electrode 250 and the drain electrode 260 at the same time.

The display device according to the embodiment of the present disclosure may further include a base insulating layer 420 between the lower substrate 100 and the auxiliary electrode 500. For example, the base insulating layer 420 may be disposed between the buffer layer 110 and the auxiliary electrode 500. The base insulating layer 420 may include an insulating material. For example, the base insulating layer 420 may include a same material as one of insulating layers between the lower substrate 100 and the source/drain electrode 250 and 260. For example, the base insulating layer 420 may include a same material as the interlayer insulating layer 240.

The base insulating layer 420 may include a base penetrating hole 420h overlapping with the auxiliary electrode 500. The auxiliary electrode 500 may include a first electrode region 501 and a second electrode region 502 which are disposed in the base penetrating hole 420h of the base insulating layer 420. For example, the first electrode region 501 and the second electrode region 502 of the auxiliary electrode 500 may be in direct contact with the buffer layer 110. The auxiliary electrode 500 may extend onto side 421S and 422S of the base insulating layer 420. For example, an end portion of the auxiliary electrode 500 may be disposed on an upper surface of the base insulating layer 420. As shown in FIGS. 2 and 3, the auxiliary electrode 500 includes at least a first part 510 extending in a first direction (e.g., horizontal direction) on the substrate 100, and a second part 512 extending in a second direction (e.g., vertical direction) intersecting with the first direction on a side surface 421S of a first opening in the base insulating layer 420. As described above, the auxiliary electrode 500 may further include a third part 514 extending in the first direction that is disposed between the lower insulating layer 430 and the base insulating layer 420. Also as described above, the auxiliary electrode 500 may include a fourth part 516 extending in the second direction on the side surface 422S of the opening in the base insulating layer 420. In one embodiment, a first width of the base penetrating hole 420h at a first distance from the first part 510 of the auxiliary electrode 500 may be wider than a second width of the base penetrating hole 420h at a second distance from the first part 510 of the auxiliary electrode 500, where the first distance is greater than the second distance. As shown in FIGS. 2 and 3, at least a portion of the first part 510 of the auxiliary electrode 500 may be in contact with the buffer layer 110. However, as described in more detail below, in other embodiments, the first part 510 of the auxiliary electrode 500 may be in contact with the substrate 100 instead of the buffer layer 110.

The display device according to the embodiment of the present disclosure may further include a lower insulating layer 430 on the base insulating layer 420 and the auxiliary electrode 500. The lower insulating layer 430 may expose the first electrode region 501 and second electrode region 502 of the auxiliary electrode 500. For example, the lower insulating layer 430 may include a lower penetrating hole 430h overlapping with the base penetrating hole 420h of the base insulating layer 420. The end portion of the auxiliary electrode 500 may be disposed between the base insulating layer 420 and the lower insulating layer 430. For example, the lower insulating layer 430 may cover an edge of the auxiliary electrode 500. The auxiliary electrode 500 disposed on the side 421S and 422S of the base penetrating hole 420h may be exposed by the lower penetrating hole 430h.

The display device according to the embodiment of the present disclosure may further include an intermediate insulating layer 440 on the lower insulating layer 430. The intermediate insulating layer 440 may expose the first electrode region 501 and the second electrode region 502 of the auxiliary electrode 500. For example, the intermediate insulating layer 440 may include an intermediate penetrating hole 440h overlapping with the lower penetrating hole 430h. The size of the intermediate penetrating hole 440h may be larger than that of the lower penetrating hole 430h. For example, side 431S and 432S of the lower insulating layer 430 overlapping with the auxiliary electrode 500 may overlap the intermediate penetrating hole 440h.

The display device according to the embodiment of the present disclosure may further include an upper insulating layer 450 on the intermediate insulating layer 440. The upper insulating layer 450 may partially expose the auxiliary electrode 500. For example, the upper insulating layer 450 may include an upper penetrating hole 450h overlapping with the second electrode region 502 of the auxiliary electrode 500. The first electrode region 501 of the auxiliary electrode 500 may be covered by the upper insulating layer 450. For example, the upper insulating layer 450 may include a protrusion region 450p overlapping with the first electrode region 501 of the auxiliary electrode 500. The lower insulating layer 430, the intermediate insulating layer 440, and the upper insulating layer 450 may form an under-cut region UC. The upper insulating layer 450 may be disposed on the second part 512 of the auxiliary electrode 500 on a side surface 421S of the base insulating layer 420, and on at least a portion of the first part 510 of the auxiliary electrode 500. The protrusion region 450p of the upper insulating layer 450 may protrude in the first direction (e.g., horizontal direction).

The protrusion region 450p of the upper insulating layer 450 may extend onto the lower penetrating hole 430h. The protrusion region 450p may extend to the inside of the intermediate penetrating hole 440h. For example, a lower surface 450bs of the protrusion region 450p facing the lower substrate 100 may be coplanar with an upper surface of the lower insulating layer 430 facing the intermediate insulating layer 440. The under-cut region UC may be formed by the lower insulating layer 430 and the upper insulating layer 450.

The lower insulating layer 430 may include a first side region 431S covered by the protrusion region 450p, and a second side region 432S exposed by the upper penetrating hole 450h. The first side region 431S of the lower insulating layer 430 may be disposed near the first electrode region 501 of the auxiliary electrode 500. The second side region 432S of the lower insulating layer 430 may be disposed close to the second electrode region 502 of the auxiliary electrode 500.

The base insulating layer 420 may include a first side region 421S disposed near the first side region 431S of the lower insulating layer 430, and a second side region 422S disposed near the second side region 432S of the lower insulating layer 430. The first side region 421S of the base insulating layer 420 may overlap the protrusion region 450p of the upper insulating layer 450. The second side region 422S of the base insulating layer 420 may overlap the upper penetrating hole 450h of the upper insulating layer 450. The auxiliary electrode 500 may extend onto the first side region 421S and the second side region 422S of the base insulating layer 420.

The under-cut region UC may be disposed between the first electrode region 501 of the auxiliary electrode 500 and the protrusion region 450p of the upper insulating layer 450. The under-cut region UC may overlap the base penetrating hole 420h. A vertical distance between the first electrode region 501 of the auxiliary electrode 500 and the protrusion region 450p of the upper insulating layer 450 may be larger than a vertical thickness of the lower insulating layer 420.

In the display device according to the embodiment of the present disclosure, the light-emitting layer 320 may extend onto the bank insulating layer 150. The light-emitting layer 320 may extend onto the auxiliary electrode 500 through the lower penetrating hole 430h, the intermediate penetrating hole 440h, and the upper penetrating hole 450h. For example, the lower insulating layer 430, the intermediate insulating layer 440 and the upper insulating layer 450 may include a same material as one of insulating layers disposed between the thin film transistor Tr1 and Tr2 and the light-emitting structure 300, respectively. For example, the lower insulating layer 430 may include a same material as the lower passivation layer 130. For example, the intermediate insulating layer 440 may include a same material as the over-coat layer 140. For example, the upper insulating layer 450 may include a same material as the bank insulating layer 150.

The light-emitting layer 320 may extend onto a side of the upper insulating layer 450 overlapping with the auxiliary electrode 500. The light-emitting layer 320 may extend onto the second side region 432S of the lower insulating layer 430 exposed by the upper penetrating hole 450h of the upper insulating layer 450. The light-emitting layer 320 may cover the auxiliary electrode 500 on the second side region 422S of the base insulating layer 420. In other words, at least a portion of the light-emitting layer 320 may contact the fourth part 516 of the auxiliary electrode 500 disposed on the side region 422S of the base insulating layer 420. The second electrode region 502 of the auxiliary electrode 500 overlapping with the upper penetrating hole 450h may be covered by the light-emitting layer 320.

The light-emitting layer 320 may be formed by a process having relative lower step coverage. For example, the step of forming the light-emitting layer 320 may include a thermal evaporation process. The light-emitting layer 320 may be cut-off by the under-cut region UC. For example, the light-emitting layer 320 may expose the lower surface 450bs of the protrusion region 450p. The first side region 431S of the lower insulating layer 430 may not be in contact with the light-emitting layer 320. The auxiliary electrode 500 on the first side region 421S of the base insulating layer 420 may not be covered by the light-emitting layer 320. The light-emitting layer 320 may not be formed on a surface of the first electrode region 501 of the auxiliary electrode 500. Also, at least a second portion 320B of the light-emitting layer 320 extending from a first portion 320A of the light-emitting layer 320 overlapping with the upper electrode 330 may contact the first part 510 of the auxiliary electrode 500 on the substrate 100. In one embodiment, the second portion 320B of the light-emitting layer 320 extends from the first portion 320A of the light-emitting layer 320 over and along a top surface of the bank insulating layer 150.

In the display device according to the embodiment of the present disclosure, the upper electrode 330 may extend along the light-emitting layer 320. Thus, at least a portion of the upper electrode 330 can be disposed on the second portion of the light-emitting layer 320 contacting the first part 510 of the auxiliary electrode 500. The upper electrode 330 may be formed by a process having relative higher step coverage. For example, the step of forming the upper electrode 330 may include a sputtering process. The upper electrode 330 may extend onto a portion exposed by the light-emitting layer 320. For example, the upper electrode 330 may extend onto the lower surface 450bs of the protrusion region 450p. The first side region 431S of the lower insulating layer 430 may be covered by the upper electrode 330. Thus, at least a portion of the upper electrode 330 may contact the side 431S of the lower insulating layer 430. The upper electrode 330 may be in direct contact with the auxiliary electrode 500 on the first side region 421S of the base insulating layer 420. Thus, at least a second portion 330B of the upper electrode 330 extending from a first portion 330A of the upper electrode 330 overlapping with the light-emitting layer 320 may contact the second part 512 of the auxiliary electrode 500 on the side 421S of the base insulating layer 420. In one embodiment, the second portion 330B of the upper electrode 330 extends from the first portion 330A of the upper electrode 330 over and along a top surface of the bank insulating layer 150. The upper electrode 330 may be formed on a surface of the first electrode region 501 of the auxiliary electrode 500. Thus, at least a portion of the upper electrode 330 may contact the first part 510 of the auxiliary electrode 500.

In the display device according to the embodiment of the present disclosure, the auxiliary electrode 500 may extend to the inside of the base penetrating hole 420h of the base insulating layer 420 disposed under the auxiliary electrode 500, and the upper insulating layer 450 on the auxiliary electrode 500 may include the protrusion region 450p overlapping with the first side region 421S of the base insulating layer 420. Thus, in the display device according to the embodiment of the present disclosure, the upper electrode 330 may be in direct contact with the first electrode region 501 of the auxiliary electrode 500 overlapping with the protrusion region 450p of the upper insulating layer 450 and the auxiliary electrode 500 on the first side region 421S of the base insulating layer 420. Therefore, in the display device according to the embodiment of the present disclosure, the contact area between the upper electrode 330 and the auxiliary electrode 500 may be increased.

In addition, in the display device according to the embodiment of the present disclosure, the contact area between the upper electrode 330 and the auxiliary electrode 500 may be proportioned to the distance of the first side region 421S of the base insulating layer 420. Thus, in the display device according to the embodiment of the present disclosure, the contact area between the upper electrode 330 and the auxiliary electrode 500 may be secured sufficiently, and the horizontal distance of the auxiliary electrode 500 may be reduced. That is, the display device according to the embodiment of the present disclosure may reduce the horizontal distance of the auxiliary electrode 500 with stable connection between the upper electrode 300 and the auxiliary electrode 500. Therefore, in the display device according to the embodiment of the present disclosure, the degree of integration may be improved.

The upper substrate 600 may be opposite the lower substrate 100. For example, the upper substrate 600 may be disposed on the light-emitting structure 300. The upper substrate 600 may include an insulating material. The upper substrate 600 may include a transparent material. For example, the upper substrate may include glass or plastic.

The filler 700 may be disposed between the lower substrate 100 and the upper substrate 600. For example, a space between the upper electrode 330 of the light-emitting structure 300 and the upper substrate 600 may be filled by the filler 700. The filler 700 may flow to the under-cut region UC through the upper penetrating hole 450h of the upper insulating layer 450.

In the display device according to the embodiment of the present disclosure, the auxiliary electrode 500 may include a first electrode region 501 and a second electrode region 502, which are disposed inside the base penetrating hole 420h of the base insulating layer 420. Thus, in the display device according to the embodiment of the present disclosure, the vertical distance of the under-cut region UC due to the lower insulating layer 430 and the upper insulating layer 450 may be increased. That is, in the display device according to the embodiment of the present disclosure, the filler 700 may smoothly flow to the inside of the under-cut region UC. Therefore, in the display device according to the embodiment of the present disclosure, the generation of the void by un-filled of the filler 700 in the under-cut region UC may be prevented.

The filler 700 may include an insulating material. The filler 700 may include a transparent material. The filler 700 may include a curable material. For example, the filler 700 may include thermosetting resin.

The display device according to the embodiment of the present disclosure is described that the light-emitting structure 300 is in direct contact with the filler 700. However, the display device according to another embodiment of the present disclosure may further include an upper passivation layer on the light-emitting structure 300. The upper passivation layer may prevent the light-emitting structure 300 from moisture of the outside and an impact. The upper passivation layer may include an insulating material. For example, the upper passivation layer may be a structure stacked an organic layer including an organic material and an inorganic layer including an inorganic material.

Accordingly, since the shape of the auxiliary electrode 500 may be changed due to the base penetrating hole 420h of the base insulating layer 420 between the lower substrate 100 and the auxiliary electrode 500, the display device according the embodiment of the present disclosure may prevent the generation of the void that is a portion not filled by the filler 700. Thus, in the display device according to the embodiment of the present disclosure, the quality displaying image may be improved, and the contact area between the upper electrode 330 and the auxiliary electrode 500 may be secured sufficiently. Therefore, in the display device according to the embodiment of the present disclosure, the reliability of the electrical connection may be improved, and the degree of integration may be increased.

Figure 4:
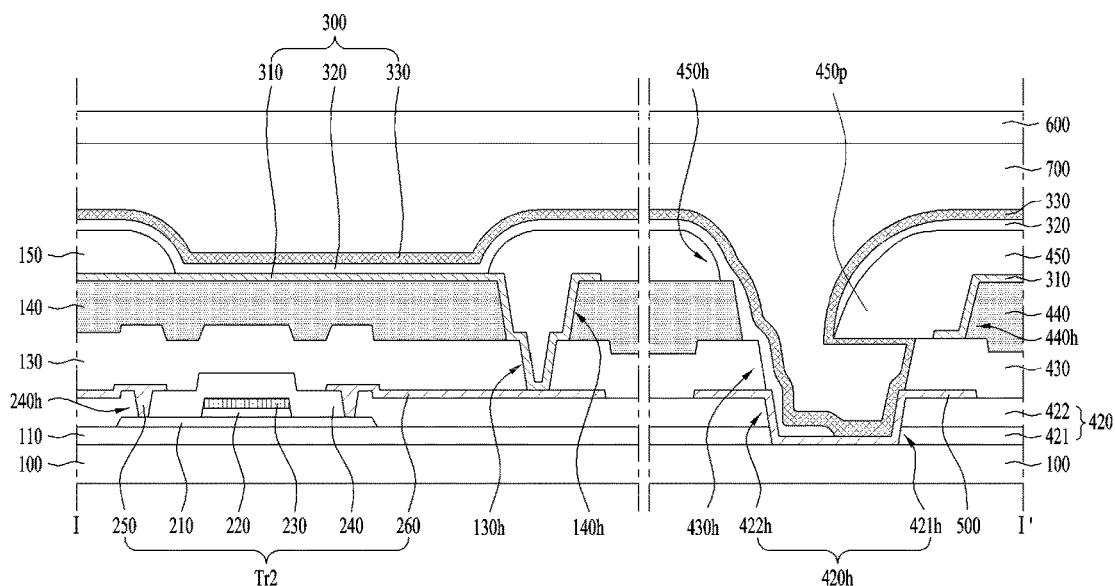
FIGS. 4 to 12 are views respectively showing various examples of a display device according to other embodiments of the present disclosure.

The display device according to the embodiment of the present disclosure is described such that the base insulating layer 420 between the buffer layer 110 and the auxiliary electrode 500 may be a single layer. However, the display device according to another embodiment of the present disclosure may include a base insulating layer 420 which is a multi-layer structure. For example, in the display device according to another embodiment of the present disclosure, the base insulating layer 420 between the lower substrate 100 and the auxiliary electrode 500 may include a first base insulating layer 421 and a second base insulating layer 422, which are sequentially stacked, as shown in FIG. 4. The first base insulating layer 421 may be disposed near the lower substrate 100. For example, the first base insulating layer 421 may be a same material as the buffer layer 110. As another example, the first base insulating layer 421 may be formed in the same layer as the buffer layer 110. The second base insulating layer 422 may be disposed between the first base insulating layer 421 and the auxiliary electrode 500. For example, the second base insulating layer 422 may include a same material as the interlayer insulating layer 240. As another example, the second base insulating layer 422 may be formed in the same layer as the interlayer insulating layer 240. The base penetrating hole 420h of the base insulating layer 420 may penetrate the first base insulating layer 421 and the second base insulating layer 422. For example, the first base insulating layer 421 may include a first base penetrating hole 421h. The second base insulating layer 422 may include a second base penetrating hole 422h overlapping with the first base penetrating hole 421h. The end portion of the auxiliary electrode 500 may be disposed between the second base insulating layer 422 and the lower insulating layer 430. The auxiliary electrode 500 may extend into the first base penetrating hole 421h and the second base penetrating hole 422h. The auxiliary electrode 500 may be in direct contact with the lower substrate 100 inside the first base penetrating hole 421h. In other words, the auxiliary electrode 500 may include a part extending in the second direction (e.g., vertical direction) on a side surface of an opening in the first base insulating layer 421 and a side surface of an opening in the second base insulating layer 422. Thus, in the display device according to another embodiment of the present invention, the path which the filler 700 flow to the under-cut region UC may be secured sufficiently, and the contact area between the upper electrode 330 and the auxiliary electrode 500 may be increased.

Figure 5:
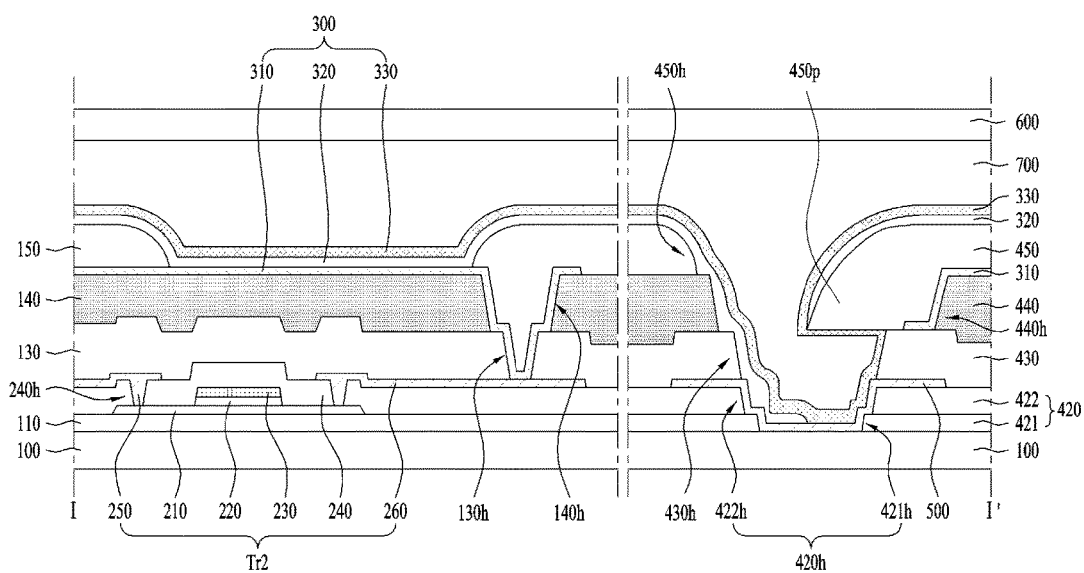

The display device according to another embodiment of the present disclosure is described such that the first base insulating layer 421 includes a side being formed continuously with a side of the second base insulating layer 422 on the auxiliary electrode 500. However, in the display device according to further another embodiment of the present disclosure, the side of the first base insulating layer 421 overlapping with the auxiliary electrode 500 is not continuous with the side of the second base insulating layer 422. For example, in the display device according to further another embodiment of the present disclosure, the size of the first base penetrating hole 421h may be smaller than that of the second base penetrating hole 422h, as shown in FIG. 5. The second base penetrating hole 422h of the second base insulating layer 422 may expose the side of the first insulating layer 421 overlapping with the auxiliary electrode 500. Thus, in the display device according to further another embodiment of the present disclosure, the generation of the void that is a portion not filled by the filler 700 may be prevented, and the upper electrode 330 may be stably connected to the auxiliary electrode 500.

Figure 6:
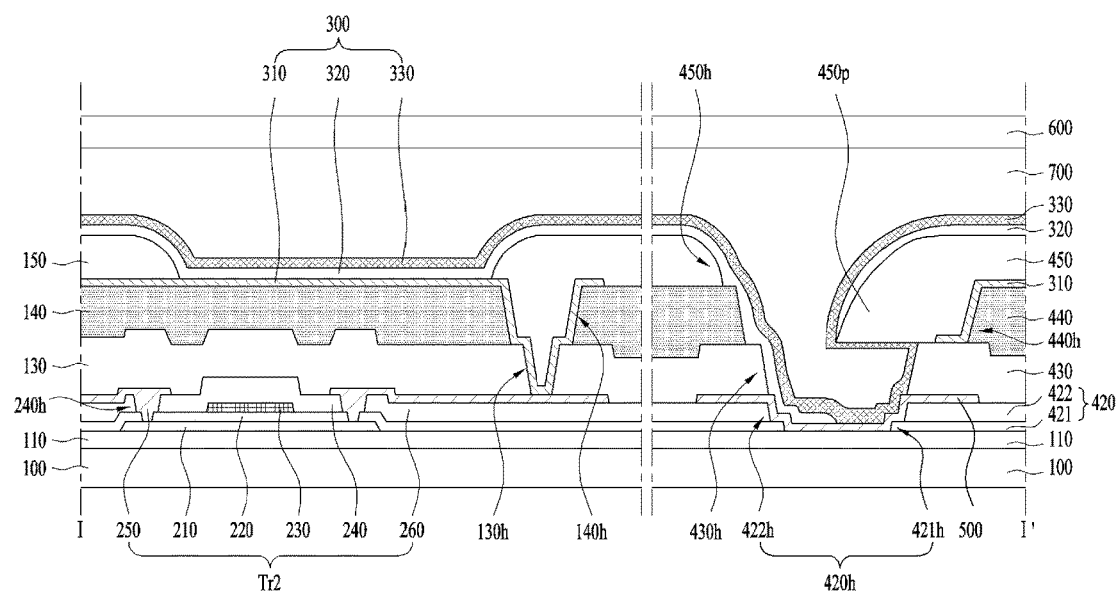

The display device according to another embodiment of the present disclosure is described that the auxiliary electrode 500 is in direct contact with the lower substrate 100 inside the base penetrating hole 420h of the base insulating layer 420 which is a multi-layer structure. However, in the display device according to further another embodiment of the present disclosure, the buffer layer 110 may extend between the lower substrate 110 and the base insulating layer 420 which is multi-layer structure, and between the lower substrate 110 and the auxiliary electrode 500, as shown in FIG. 6. For example, the first base insulating layer 421 may include a same material as the gate insulating layer 220 between the semiconductor pattern 210 and the gate electrode 230. As another example, the first base insulating layer 421 may be formed in the same layer as the gate insulating layer 220. Thus, in the display device according to further another embodiment of the present disclosure, the quality displaying image, the reliability, and the degree of integration may be effectively improved.

Figure 7:
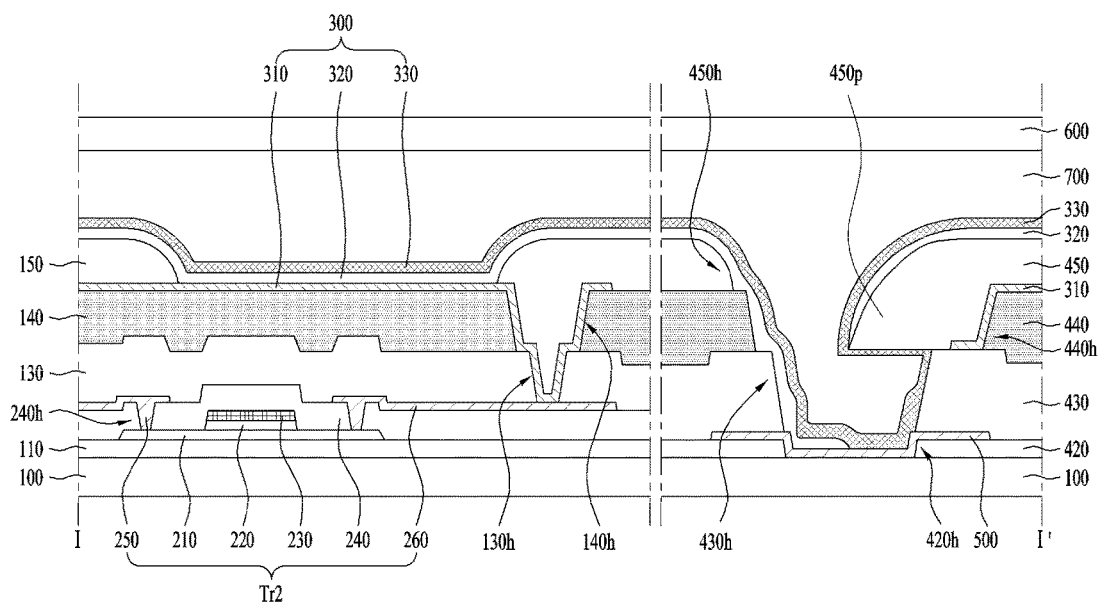

The display device according to the embodiment of the present disclosure is described such that the base insulating layer being a single layer includes a same material as the interlayer insulating layer 240. However, in the display device according to another embodiment of the present disclosure, the interlayer insulating layer 240 may not extend between the lower substrate 100 and the auxiliary electrode 500. For example, in the display device according to another embodiment of the present disclosure, the base insulating layer 420 of the single layer disposed between the lower substrate 100 and the auxiliary electrode 500 may include a same material as buffer layer 110, as shown in FIG. 7. As another example, the base insulating layer 420 may be formed in the same layer as the buffer layer 110. Thus, in the display device according to another embodiment of the present disclosure, the flow path of the filler 700 and the contact area between the upper electrode 330 and the auxiliary electrode 500 may be secured sufficiently.

Figure 8:
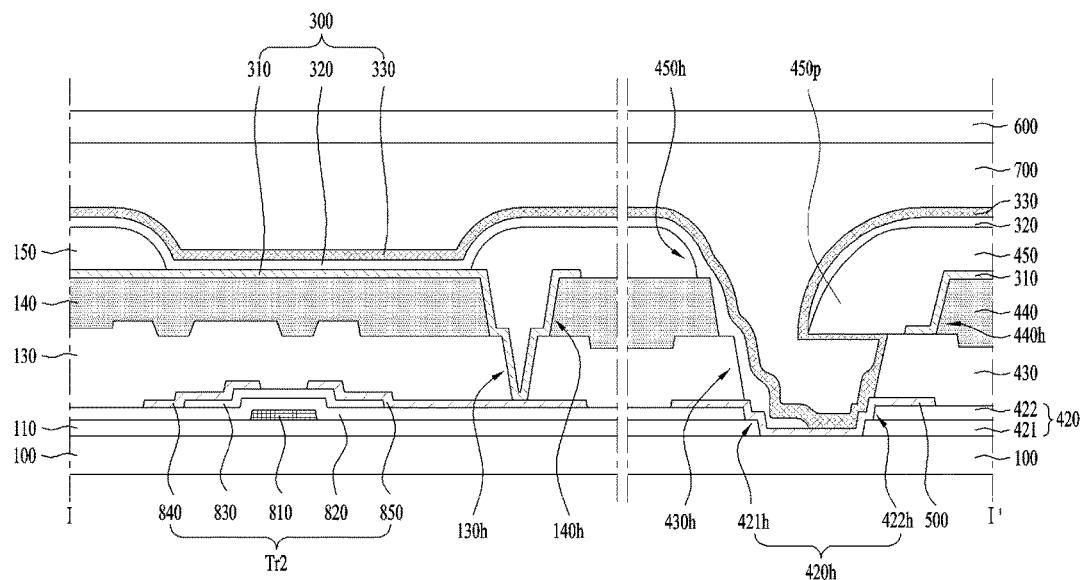

The display device according to the embodiment of the present disclosure is described that the thin film transistor Tr1 and Tr2 includes the interlayer insulating layer 240 between the gate electrode 230 and the source/drain electrodes 250 and 260. However, in the display device according to another embodiment of the present disclosure, the thin film transistor Tr1 and Tr2 may include a gate electrode 810 disposed near the lower substrate 100, a gate insulating layer 820 on the gate electrode 810, a semiconductor pattern 830 on the gate insulating layer 820, a source electrode 840 on an end portion of the semiconductor pattern 830, and a drain electrode 850 on another end portion of the semiconductor pattern 830, as shown in FIG. 8. Thus, in the display device according to another embodiment of the present disclosure, a base insulating layer 420 of a multi-layer structure disposed between the lower substrate 100 and the auxiliary electrode 500 may include a first base insulating layer 421 having a same material as the buffer layer 110, and a second base insulating layer 422 having a same material as the gate insulating layer 820. As another example, the first base insulating layer 421 may be formed in the same layer as the buffer layer 110, and the second base insulating layer 422 may be formed in the same layer as the gate insulating layer 820. The second base penetrating hole 422h of the second base insulating layer may expose a side of the first base insulating layer 421 overlapping with the auxiliary electrode 500. For example, the second base penetrating hole 422h of the second base insulating layer 422 may form a step with the first base penetrating hole 421h of the first base insulating layer 421. Also, the auxiliary electrode 500 may include a part extending in the second direction (e.g., vertical direction) on a side surface of an opening in the first base insulating layer 421 and on a side surface of an opening in the second base insulating layer 422. Therefore, in the display device according to another embodiment of the present disclosure, since the various type thin-film transistors Tr1 and Tr2 may be used, the quality of displaying the image, the reliability of the electrically connection, and the degree of integration may be efficiently improved.

Figure 9:
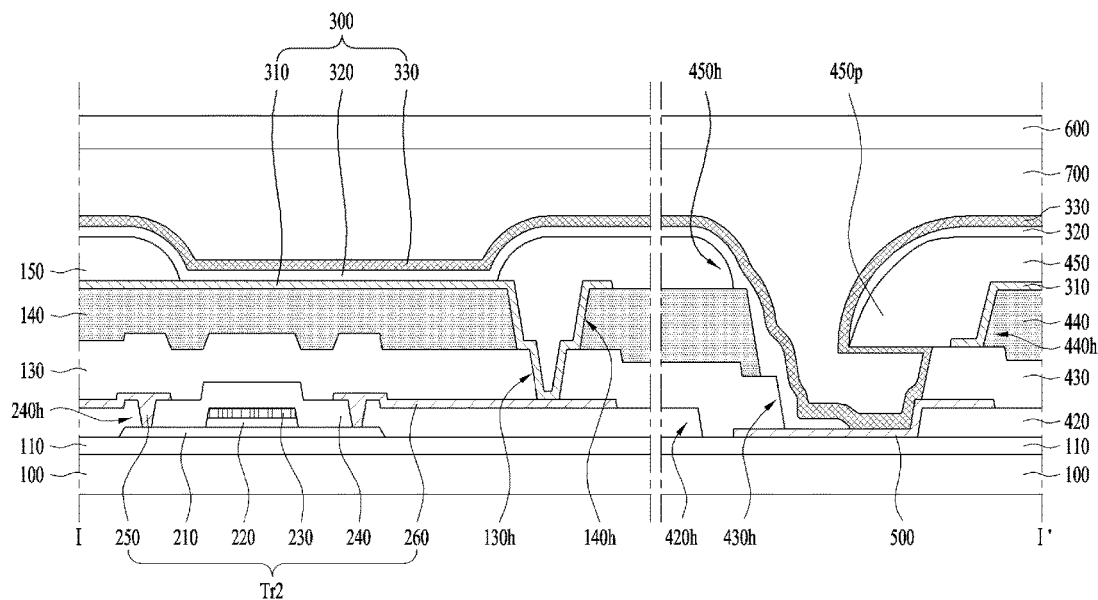

The display device according to the embodiment of the present disclosure is described that the end portion of the auxiliary electrode 500 is disposed between the base insulating layer 420 and the lower insulating layer 430. However, in the display device according to another embodiment of the present disclosure, an end portion of the auxiliary electrode 500 disposed near a region of the auxiliary electrode 500 overlapping with the upper penetrating hole 450h of the upper insulating layer 450 may be disposed inside the base penetrating hole 420h of the base insulating layer 420, as shown in FIG. 9. For example, in the display device according to another embodiment of the present disclosure, the auxiliary electrode 500 inside the base penetrating hole 420h of the base insulating layer 420 on the lower substrate 100 may extend onto the side of the base insulating layer 420 overlapping the protrusion region 450p of the upper insulating layer 450. Thus, in the display device according to another embodiment of the present disclosure, the upper electrode 330 may be stably connected to the auxiliary electrode 500, and the filler 700 may smoothly flow.

Figure 10:
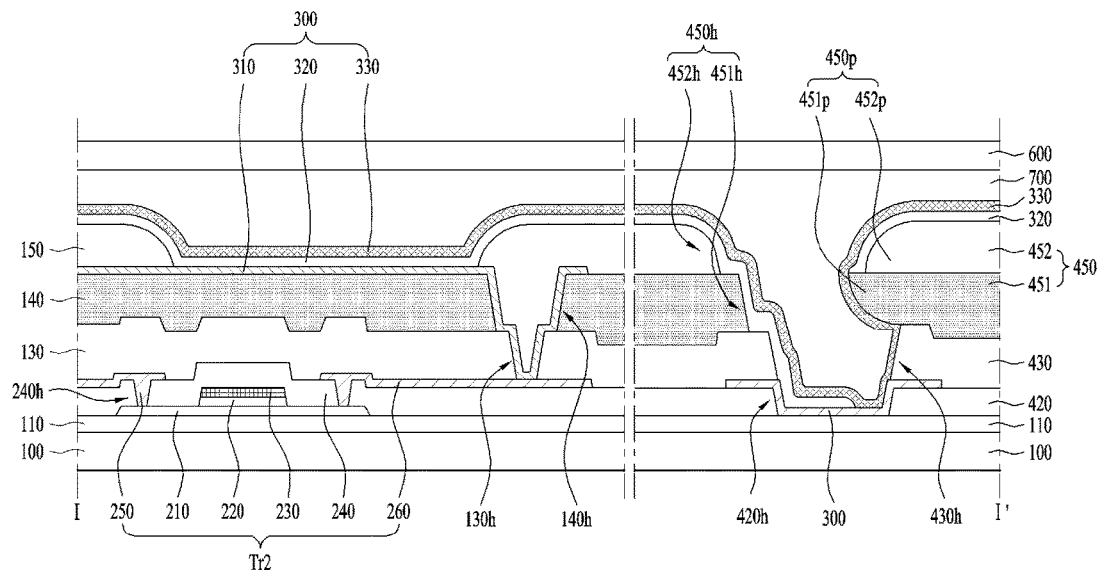

The display device according to the embodiment of the present disclosure is described such that the intermediate insulating layer 440 is disposed between the lower insulating layer 430 and the upper insulating layer 450 of the single layer. However, in the display device according to another embodiment of the present disclosure, the upper insulating layer 450 on the lower insulating layer 430 may be a multi-layer structure. For example, in the display device according to another embodiment of the present disclosure, the upper insulating layer 450 may include a first upper insulating layer 451 and a second upper insulating layer 452, which are sequentially stacked on the lower insulating layer 430, as shown in FIG. 10. The first upper insulating layer 451 may be in direct contact with the lower insulating layer 430. For example, the first upper insulating layer 451 may include a same material as the over-coat layer 140. The second upper insulating layer 452 may include a same material as the bank insulating layer 150. As another example, the first upper insulating layer 451 may be formed in the same layer as the over-coat layer 140, and the second upper insulating layer 422 may be formed in the same layer as the bank insulating layer 150. The first upper insulating layer 451 may include a first upper penetrating hole 451h and a first protrusion region 451p. The second upper insulating layer 452 may include a second upper penetrating hole 452h and a second protrusion region 452p. The size of the first upper penetrating hole 451h may be smaller than that of the second upper penetrating hole 452h. For example, the horizontal distance of the second protrusion region 452p extending onto the lower penetrating hole 430h may be smaller than that of the first protrusion region 451p extending onto the lower penetrating hole 430h. A side of the first upper insulating layer 451 overlapping with the auxiliary electrode 500 may be a shape different from a side of the second upper insulating layer 452 overlapping with the auxiliary electrode 500. For example, the side of the first upper insulating layer 451 overlapping with the auxiliary electrode 500 may be negatively tapered. Thus, in the display device according to another embodiment of the present disclosure, the generation of the void by the filler 700 may be effectively prevented with increasing the contact area between the upper electrode 330 and the auxiliary electrode 500.

Figure 11:
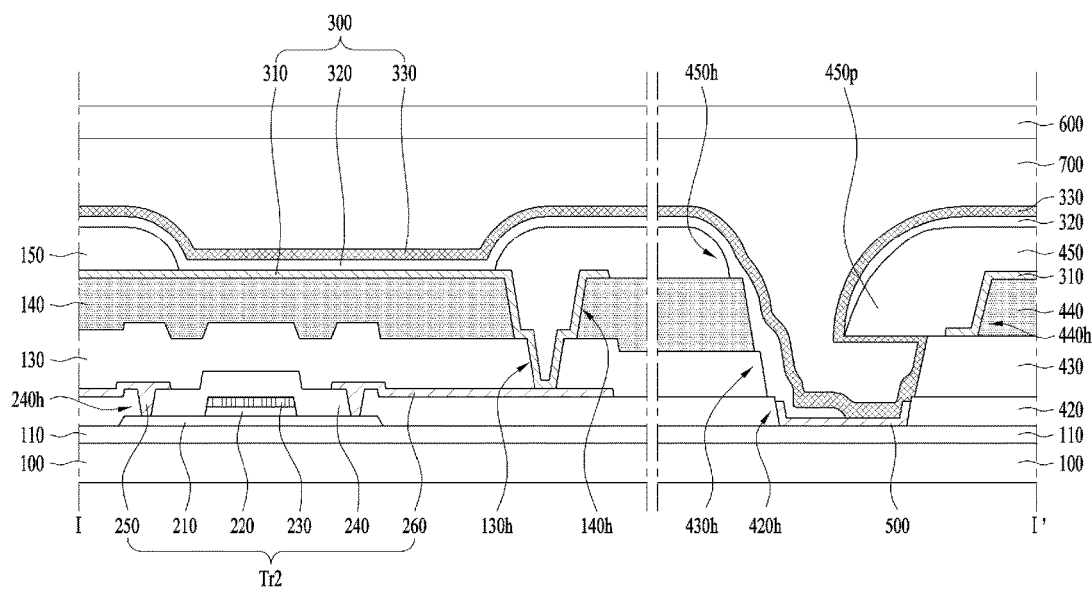

The display device according to the embodiment of the present disclosure is described such that the end portion of the auxiliary electrode 500 is disposed on the upper surface of the base insulating layer 420 facing the upper substrate 600. However, in the display device according to another embodiment of the present disclosure, the auxiliary electrode 500 may include an end portion on the side of the base insulating layer 420, as shown in FIG. 11. For example, in the display device according to another embodiment of the present invention, a cross-section of the auxiliary electrode 500 may be 'U' shape. Thus, in the display device according to another embodiment of the present disclosure, the quality of displaying an image may be improved, and the degree of integration may be increased.

Figure 12:
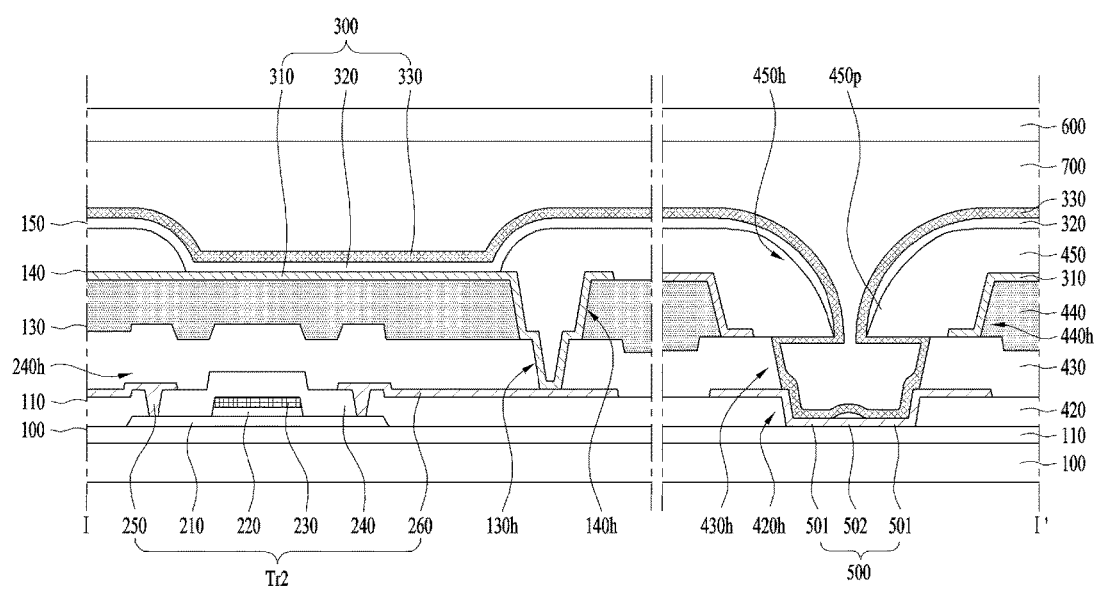

The display device according to the embodiment of the present disclosure is described such that the base insulating layer 420 includes the second side region 422S exposed by the upper penetrating hole 450h of the upper insulating layer 450. However, in the display device according to another embodiment of the present disclosure, all regions of the side of the base insulating layer 420 is covered by the protrusion region 450p of the upper insulating layer 450, as shown in FIG. 12. For example, in the display device according to another embodiment of the present disclosure, the second electrode region 502 of the auxiliary electrode 500 overlapping with the upper penetrating hole 450h may be surrounded by the first electrode region 501 of the auxiliary electrode 500 overlapping with the protrusion region 450p. Thus, in the display device according to another embodiment of the present disclosure, the degree of integration and the quality of displaying the image may be improved by stable connection between the upper electrode 330 and the auxiliary electrode 500.

In the result, the display device according to the embodiments of the present disclosure may increase the contact area between the upper electrode and the auxiliary electrode with sufficiently securing a path flowing the filler to the under-cut region. Thus, in the display device according to the embodiments of the present disclosure, the generation of the void due to a portion not filled by the filler may be prevented, and the connection between the upper electrode and the auxiliary electrode may be stable. Therefore, in the display device according to the embodiments of the present disclosure, the quality of displaying the image and the reliability of the electrical connection may be improved, and the degree of integration may be increased.

What is claimed is:

1. A display device, comprising:
    a first base insulating layer having a first opening;
    an auxiliary electrode including:
        a first part extending in a first direction, and
        a second part extending in a second direction intersecting with the first direction, the second part on a side surface of the first opening in the first base insulating layer;
    a first upper insulating layer over the second part of the auxiliary electrode and over at least a portion of the first part of the auxiliary electrode, the first upper insulating layer protruding in the first direction toward the first opening in the first base insulating layer from the side surface of the first opening in the first base insulating layer, an under-cut region including a gap being formed between the first part of the auxiliary electrode and the first upper insulating layer; and
    a light emitting structure including an upper electrode, at least a part of the upper electrode contacts the second part of the auxiliary electrode.

2. The display device of claim 1, further comprising a lower insulating layer on the first base insulating layer, the lower insulating layer having a second opening, and wherein the upper electrode contacts a side surface of the second opening in the lower insulating layer, and wherein the auxiliary electrode includes a third part extending in the first direction and disposed between the lower insulating layer and the first base insulating layer.

3. The display device of claim 1, wherein the auxiliary electrode includes a third part extending in the second direction on another side surface of the first opening in the first base insulating layer.

4. The display device of claim 3, wherein the light emitting structure includes a light-emitting layer that contacts the third part of the auxiliary electrode.

5. The display device of claim 1, wherein a vertical distance in the second direction between the first part of the auxiliary electrode and the first upper insulating layer is greater than a thickness of the first base insulating layer.

6. The display device of claim 1, further comprising:
    a thin film transistor (TFT) on a part of the first base insulating layer, the TFT electrically connected to the light emitting structure,
    wherein the first part of the auxiliary electrode contacts a substrate on which the part of the first base insulating layer is formed.

7. The display device of claim 6, further comprising:
    a second base insulating layer on the first base insulating layer, the second base insulating layer having a second opening,
    wherein the auxiliary electrode includes a third part extending in the second direction on a side surface of the second opening in the second base insulating layer.

8. The display device of claim 7, wherein the upper electrode contacts the third part of the auxiliary electrode.

9. The display device of claim 7, wherein the TFT includes a drain electrode, a semiconductor layer, and a part of the second base insulating layer between the drain electrode and the semiconductor layer.

10. The display device of claim 7, wherein the TFT includes a part of the second base insulating layer as a gate insulating layer of the TFT.

11. The display device of claim 1, further comprising:
    a buffer layer; and
    a thin film transistor (TFT) on the buffer layer electrically connected to the light emitting structure,
    wherein the first base insulating layer is on the buffer layer, and wherein the first part of the auxiliary electrode contacts the buffer layer.

12. The display device of claim 11, wherein the TFT includes a drain electrode, a semiconductor layer, and an interlayer insulation layer between the drain electrode and the semiconductor layer, and the first base insulating layer includes a same material as the interlayer insulating layer of the TFT.

13. The display device of claim 11, wherein the TFT includes a gate insulating layer, and the first base insulating layer is in a same layer as the gate insulating layer.

14. The display device of claim 13, further comprising:
    a second base insulating layer on the first base insulating layer, the second base insulating layer having a second opening,
    wherein the auxiliary electrode includes a third part extending in the second direction on a side surface of the second opening in the second base insulating layer.

15. The display device of claim 14, where the upper electrode contacts the third part of the auxiliary electrode.

16. The display device of claim 1, further comprising:
    a second upper insulating layer on the first upper insulating layer, over the second part of the auxiliary electrode, and over the portion of the first part of the auxiliary electrode, the second upper insulating layer protruding in the first direction.

17. The display device of claim 1, wherein a first width of the first opening at a first distance from the first part of the auxiliary electrode is wider than a second width of the first opening at a second distance from the first part of the auxiliary electrode, and wherein the first distance is greater than the second distance.

18. A display device comprising:
    a base insulating layer on a lower substrate, the base insulating layer including a base penetrating hole;
    a lower insulating layer on the base insulating layer, the lower insulating layer including a lower penetrating hole overlapping with the base penetrating hole;
    an upper insulating layer disposed on the lower insulating layer in a first direction, the upper insulating layer including a protrusion region, the protrusion region extending onto the lower penetrating hole and toward the lower penetrating hole in a second direction intersecting the first direction from a side surface of the lower penetrating hole; and
    an auxiliary electrode inside the base penetrating hole on the lower substrate,
    wherein the auxiliary electrode extends onto a first side region of the base insulating layer and at least a part of the auxiliary electrode on the first side region of the base insulating layer overlaps with the protrusion region of the upper insulating layer, an under-cut region including a gap being formed between the auxiliary electrode and the protrusion region of the upper insulating layer.

19. A display device comprising:
a base insulating layer on a lower substrate, the base insulating layer including a base penetrating hole;
an auxiliary electrode on the lower substrate and the base insulating layer, the auxiliary electrode including a first electrode region and a second electrode region which are disposed inside the base penetrating hole;
a lower insulating layer on the base insulating layer, the lower insulating layer including a lower penetrating hole overlapping with the base penetrating hole; and
an upper insulating layer disposed on the lower insulating layer in a first direction,
wherein the upper insulating layer includes a protrusion region overlapping with the first electrode region of the auxiliary electrode, the protrusion region protruding towards the lower penetrating hole in a second direction intersecting the first direction from a side surface of the lower penetrating hole, and an upper penetrating hole overlapping with the second electrode region of the auxiliary electrode, an under-cut region including a gap being formed between the second electrode region of the auxiliary electrode and the protrusion region of the upper insulating layer.

* * * * *